United States Patent [19]

Williams et al.

[11] Patent Number: 4,731,537

[45] Date of Patent: Mar. 15, 1988

[54] ELECTRON BEAM GUN

[75] Inventors: Kenneth E. Williams, Andover; P. Michael Fletcher, North Reading, both of Mass.

[73] Assignee: Sony Corporation, Tokyo, Japan

[21] Appl. No.: 744,396

[22] Filed: Jun. 13, 1985

[51] Int. Cl.[4] .......................... G01K 1/08; G21K 1/08; H01J 3/14; H01J 3/22

[52] U.S. Cl. ...................... 250/396 ML; 219/121 EA; 219/121 EB; 219/121 ER; 250/398; 250/400; 250/492.2; 373/14

[58] Field of Search ............... 373/13, 14, 10, 11; 250/398, 492.2, 396 R, 396 ML, 400, 492.3; 219/121 EB, 121 ES, 121 ET, 121 EA, 121 ER, 121 EM; 313/453; 315/5.35

[56] References Cited

U.S. PATENT DOCUMENTS

| | | | |
|---|---|---|---|
| 2,968,723 | 1/1961 | Steigerwald | 250/400 |
| 3,347,701 | 10/1967 | Yamagishi et al. | 219/121 ER |
| 3,814,829 | 6/1974 | Movchan et al. | 373/14 |
| 4,058,667 | 11/1977 | Forsen | 373/14 |
| 4,382,186 | 5/1983 | Denholm | 250/492.2 |

FOREIGN PATENT DOCUMENTS

| | | | |
|---|---|---|---|
| 2623337 | 12/1977 | Fed. Rep. of Germany | 250/396 ML |
| 2026732A | 2/1980 | United Kingdom | 219/121 EA |

*Primary Examiner*—Craig E. Church
*Assistant Examiner*—T. N. Grigsby
*Attorney, Agent, or Firm*—Lewis H. Eslinger

[57] ABSTRACT

An electron beam gun generates an electron beam directed at a target. The gun comprises electrodes for creating an electric field along the direction of beam travel and focusing coils for creating a magnetic field along the direction of beam travel. The electrodes include a plurality of members each having a beam-shaping aperture therein for passage of the beam substantially without interception of the electrons in the beam. The electrodes and focusing coils are disposed for accelerating electrons in the beam in non-parallel paths through the beam-shaping apertures and for converging the electrons in the beam in at least one cross-sectional dimension of the beam to minimize that dimension at the target.

4 Claims, 20 Drawing Figures

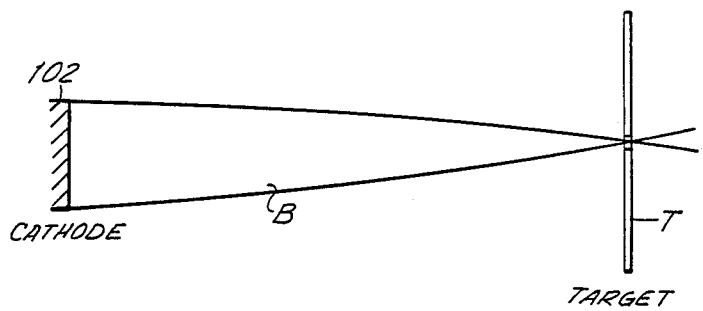
FIG. 7A
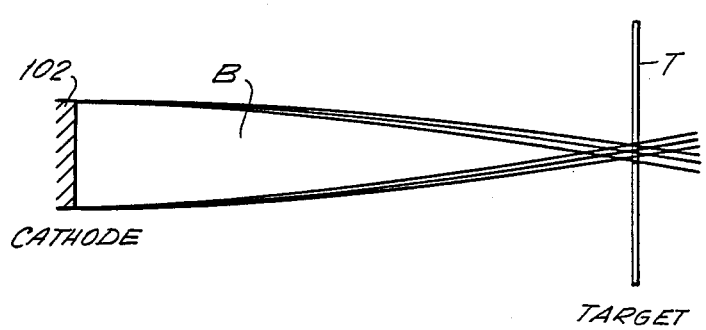
FIG. 7B
FIG. 8
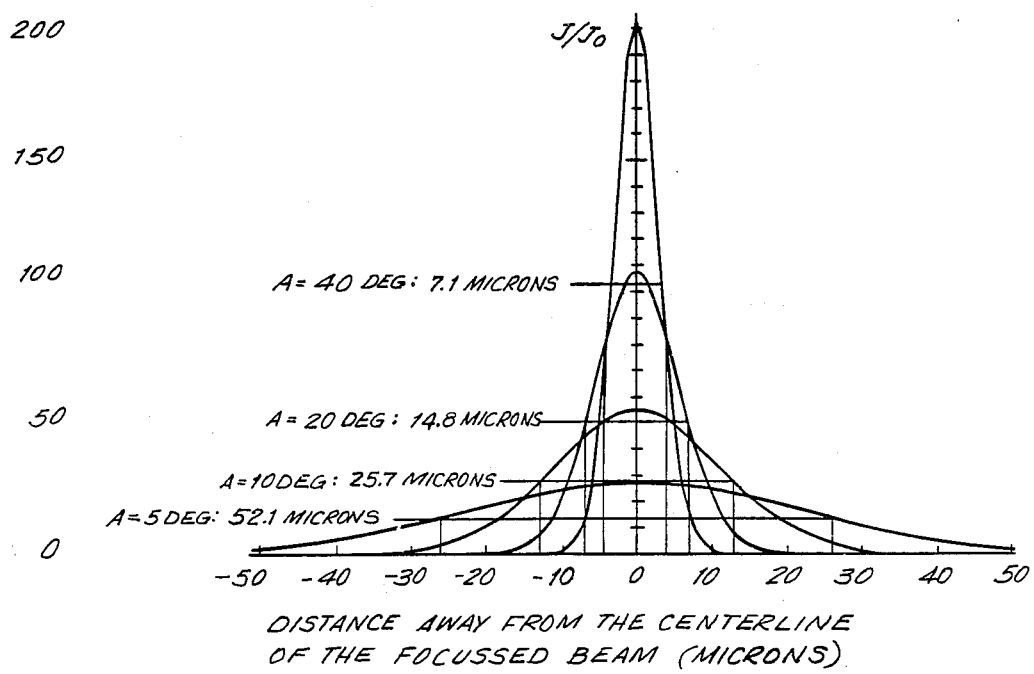

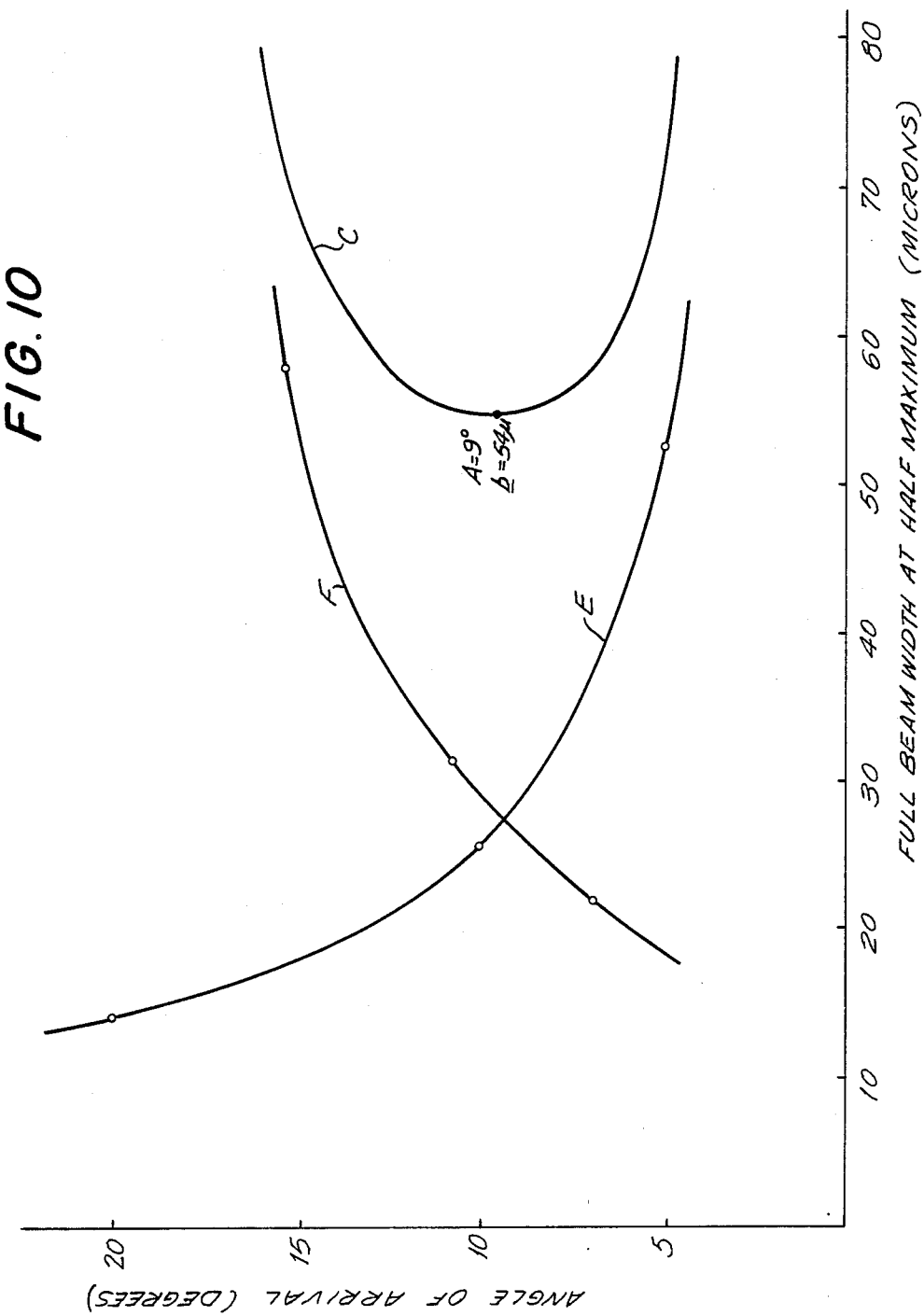

ELECTRON BEAM GUN

BACKGROUND OF THE INVENTION

1. Field of the Invention

The present invention relates to an electron gun and, more particularly, to an electron gun for creating a high-intensity electron beam.

2. Description of the Prior Art

The utility of a high-intensity, fine-line electron beam in various processes is discussed in U.S. Pat. No. 4,382,186 (which has been disclaimed in favor of application Ser. No. 455,266, now U.S. Pat. No. 4,446,373, which is assigned to the assignee of the present invention). Such an electron beam can be used, as disclosed therein, for fabricating semiconductor devices and generally modifying the surface of materials in various advantageous ways.

One such operation that has great potential commercial significance is the formation of a large single crystal from a layer of amorphous silicon on a substrate. The amorphous silicon is melted using a strip electron beam and then recrystalized into a single crystal. That is disclosed in U.S. Pat. Nos. 4,382,186 and 4,446,373. However, that operation cannot be optimally performed with existing electron beam guns.

The "power density" or "flux" of the electron beam has been found to be a critical parameter in enabling the formation of a single silicon crystal from an amorphous layer of polysilicon. The power density of the beam is the wattage per unit area to which the beam target is subjected. If an electron beam comprises a given number of electrons each having a particular kinetic energy as it reaches the target, the power density in megawatts (MW) per square centimeter ($cm^2$) is increased as the beam area is reduced.

Presently known electron guns capable of producing a fine-line electron beam can provide power densities in the range up to 0.2 $MW/cm^2$. However, that power density, while adequate for production of large, single-crystal semiconductor devices of recrystallization of an amorphous layer that was melted using the electron beam, is too low for optimal efficiency.

SUMMARY OF THE INVENTION

It is an object of the present invention to overcome those shortcomings of the prior art.

It is another object of the present invention to provide an electron gun capable of generating an intense, fine-line electron beam with increased power densities.

The foregoing and other objects are attained in an electron beam gun for generating an electron beam directed at a target, the gun comprising electrode means for creating an electric field along the direction of beam travel and focusing means for creating a magnetic field along the direction of beam travel. In accordance with the invention, the electrode means includes a plurality of electrode members each having a beam-shaping aperture therein for passage of the beam substantially without interception of the electrons in the beam, and the electrode means and focusing means are disposed for accelerating electrons in the beam in non-parallel paths through the beam-shaping apertures and for converging the electrons in the beam in at least one cross-sectional dimension of the beam to minimize that dimension at the target.

The preceding and other objects, features and advantages of the invention will be apparent in the following detailed description of an illustrative embodiment of the invention which is to be read in connection with the accompanying drawings, wherein the same reference numerals are used to identify corresponding parts in the several views.

BRIEF DESCRIPTION OF THE DRAWINGS

FIGS. 7A and 7B schematically depict, respectively, a perfectly focused beam of electrons having no thermal energies and the same beam when the thermal energies of the electrons are taken into account.

FIG. 8 is a plot of the distribution of the electrons at the focus of four electron beams generated using an electron beam gun in accordance with an embodiment of the present invention illustrating the effect on the beam width of the beam angle of arrival when the thermal energy of the electrons is taken into account.

FIG. 10 is a plot of the beam widths shown in FIGS. 8 and 9A–9D versus beam angle of arrival and of the beam width as a result of the combined effect of the thermal energies of the electrons and focusing aberrations.

DETAILED DESCRIPTION OF PREFERRED EMBODIMENTS

The advantages of the present invention can best be understood by first gaining an understanding of prior art electron beam guns.

Figure 1:
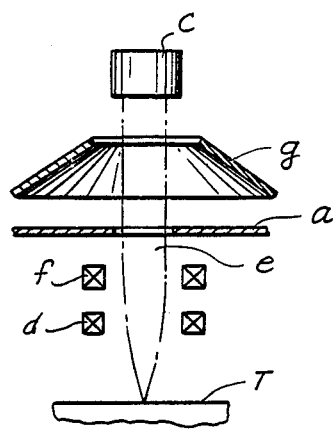
FIG. 1 schematically depicts a prior art Pierce electron beam gun using a conventional frustoconical electrode for forming an electron beam.

The type of electron beam gun used most widely for forming an intense electron beam is a "Pierce gun", so called after its developer. FIG. 1 schematically depicts a typical Pierce gun.

In the Pierce gun shown in FIG. 1, a thermionic cathode c is heated in a conventional manner, such as by electrical resistance heating, to emit electrons. A grid electrode g and an anode electrode a create an electric field that forms the electrons emitted by the cathode c into a beam e. A focusing coil f creates a magnetic field to focus the beam e into a spot or line at a target T. For some applications a deflection coil d can be used to generate and modulate a magnetic field that can direct the focused beam on different locations on the target T.

The grid g is made in a frustoconical shape that is characteristic of Pierce guns. The shape of the grid g is so chosen because the electron beam e is to be formed into electrons moving in parallel paths as they travel through the grid and anode electrodes. The shape of the electric field required to provide such an electron beam can be calculated using known techniques. That shape turns out to be generally frustoconical and the grid electrode g and the anode electrode a are thus made with the configurations required to provide an electric field with the desired shape.

In accordance with well-known principles of physics, the power density (intensity) of beam e will be increased, other factors being equal, if the electrodes are more closely spaced together. Theoretically, of course, it is possible to provide a plurality of closely spaced, frustoconical electrodes nested within each other. However, from a practical standpoint, such a mounting arrangement presents problems in providing the necessary dimensional tolerances and in isolating the electrodes from each other so that the desired electrical field is created. In practice those problems are virtually insurmountable.

In most prior art applications, the beam intensities obtainable using a Pierce gun are sufficient. In fact, a Pierce gun can create an electron beam with properties that demonstrate the feasibility of the processes disclosed in U.S. Pat. Nos. 4,382,186 and 4,446,373. However, it is desirable to achieve a power density of an electron beam sufficiently high to grow large crystals consistently without defects by means of an electron beam gun that is simpler and smaller than a conventional Pierce gun.

The electron beam gun in accordance with the present invention solves the problem by enabling the creation of a significantly more intense beam. In a preferred embodiment, the present invention accomplishes that object by using substantially planar electrodes to create the electric field that forms the electron beam. The practical problems in mounting the electrodes are overcome by using substantially planar electrodes. The use of closely spaced, planar electrodes in an electron beam gun in accordance with the present invention enables increases in power densities from about 0.2 MW/cm$^2$, which is about the maximum that has been achieved with the electron beam gun previously used, to 1.0 MW/cm$^2$ or more.

Figure 2:
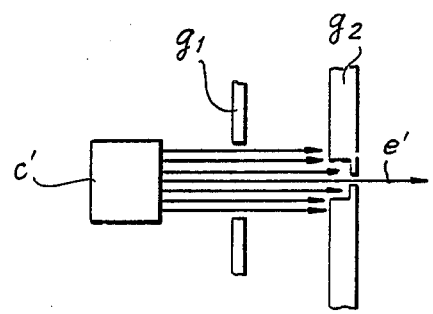
FIG. 2 schematically depicts a conventional prior art electron beam gun that uses planar electrodes to intercept parts of a larger electron beam to form a small diameter electron beam.

Of course, the use of planar electrodes in an electron beam gun is, as such, known. FIG. 2 illustrates schematically an electron beam gun used in a conventional television or cathode-ray tube. Electron guns like that shown in FIG. 2 are used, for example, to create a spot electron beam e' that is directed at a phosphorescent coating on the cathode-ray tube screen to create a picture when the spot beam scans the screen.

In the gun shown in FIG. 2 two planar grids $g_1$ and $g_2$ are used to create the spot electron beam e'. A thermionic cathode c' emits electrons that are shaped into a beam by the grid electrodes $g_1$ and $g_2$. As shown in FIG. 2, the grid electrode $g_2$ forms a spot beam of sufficiently small size merely by intercepting a large part of the beam. Other similar arrangements are possible in which the grid $g_1$ intercepts the beam or both grids $g_1$ and $g_2$ intercept the beam. An electron beam formed by an electron beam gun that intercepts parts of the electron beam, such as is shown in FIG. 2, is not capable of providing an electron beam with sufficient power density for the applications discussed in U.S. Pat. Nos. 4,382,186 and 4,446,373.

Decreasing the distance between the electrodes in an electron beam gun increases the intensity of the electric field to which the electron beam is subjected. That is, the potential gradient between the electrodes is higher for the same potential difference between the electrodes. As a result, the electrons provided by the cathode can be formed into a more intense beam, as will become more apparent from the following detailed description of preferred embodiments of the invention.

Figure 3:
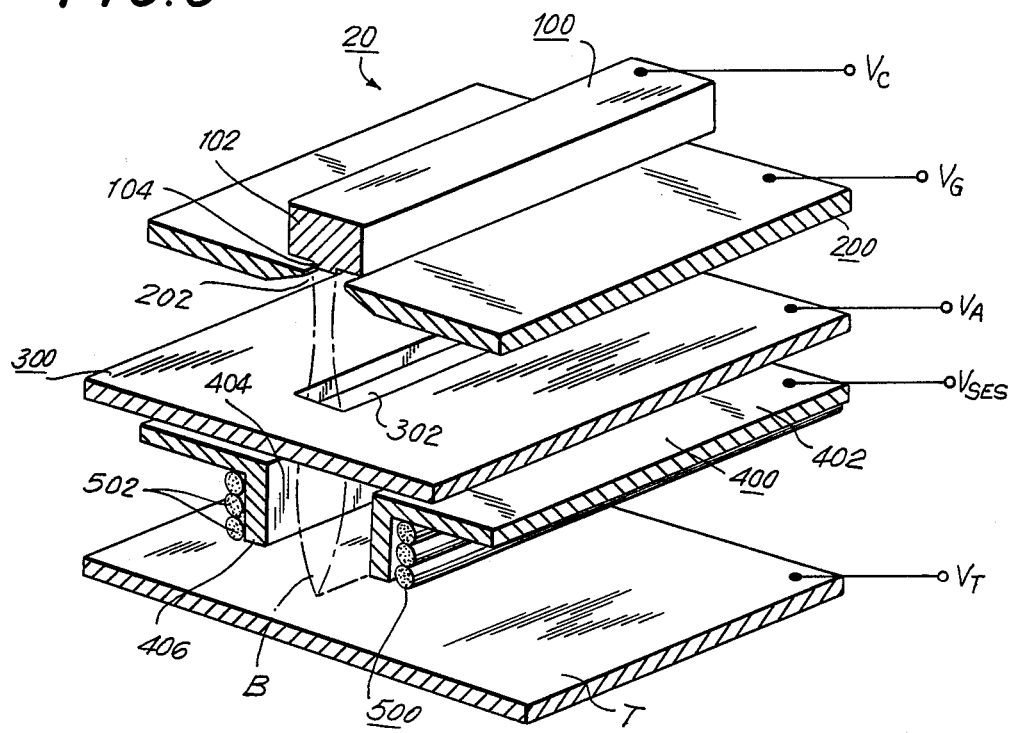
FIG. 3 is a schematic isometric view of an electron beam gun in accordance with one embodiment of the present invention.

FIG. 3 is a schematic isometric view of an electron beam gun 20 that incorporates the features of a preferred embodiment of the present invention. The gun 20 includes a cathode 100 that is made of a suitable material such as sintered tungsten. An emitting island 104 is formed on one side of the cathode 100 by impregnating the cathode surface with barium oxide (BaO), alumina ($Al_2O_3$) and magnesium oxide ($Mg_2O$). A filament (not shown in FIG. 3) is disposed internally of the cathode 100. An electric current is passed through the filament, which is heated by resistance heating, thus heating the cathode 100 and causing thermionic emission of electrons, primarily from the barium in the BaO impregnating the emitting island 104. The cathode 100 is maintained at an electrical potential of $V_c$ when the gun 20 is operating.

A first planar electrode comprising a grid 200 is disposed near the cathode 100 as shown in FIG. 3. The grid 200 includes a first beam-forming aperture 202 through which the electrons emitted from the cathode 100 pass when the electron beam gun 20 is operating. The grid 200 is maintained at an electrical potential of $V_G$ when the gun 20 is operating.

A second planar electrode comprising an anode 300 is spaced from the grid 200. A second-beam forming aperture 302 in the anode 300 provides a passage for the beam. The anode 300 is maintained at an electrical potential of $V_A$ when the gun 20 is operating.

An auxiliary electrode 400 is spaced from the anode 300. The auxiliary electrode 400 includes a planar portion 402 having an auxiliary beam-shaping aperture 404 therein for passage of the beam. The auxiliary beam-shaping aperture 404 has a depending flange 406 surrounding it. The auxiliary electrode 400 is maintained at an electrical potential of $V_{SES}$ when the gun 20 is operating.

A focusing means 500 includes a plurality of wire coils 502 that run along the outside of the flange 406 as shown in FIG. 3 and form a focusing magnet. The coils 502 carry a direct current that creates a magnetic field for focusing the electrons in the beam. Coils 502 loop around the ends of the beam to provide continuous flow paths, and a correcting coil 508c (FIGS. 12 and 13) cooperates with the coils 502 to minimize beam distortion as discussed below.

In operation the electron beam gun 20 is maintained in a vacuum. The electrons thermionically emitted from the cathode 100 are formed into a beam B which is focused at the surface of the target T. When the gun 20 is operating, the target T is maintained at an electrical potential of $V_T$. The electron beam B is shaped and focused as it passes through the apertures 202, 302 and 404. The shape and properties of the beam B are determined by the differences in the potentials $V_C$, $V_G$, $V_A$, $V_{SES}$ and $V_T$, the spacings and configurations of the cathode 100 and the various electrodes 200, 300 and 400, the location of the target T and the location and configuration of and the current in the coils 502 and 508c.

Ideally, at its intersection with the target T, the beam B is a line that is infinitesimal in width with a power density approaching infinity. In practice, however, physical limitations prevent the beam from being focused to that degree.

Figure 4:
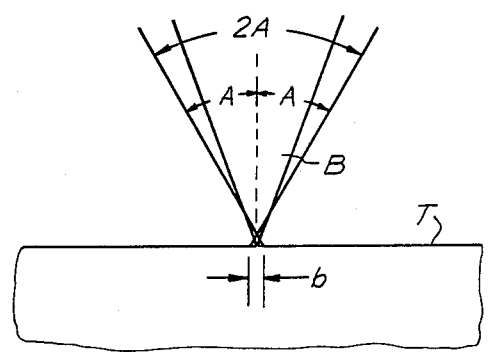
FIG. 4 schematically depicts an electron beam focused on a target illustrating how the beam's angle of arrival is measured.

FIG. 4 schematically depicts the beam B in cross-section at the target T. The beam B has a finite width b, for reasons explained in detail below, and is symmetrical about a plane that extends normal to the target T and bisects the apertures 202, 302 and 404 and the emitting island 104. In addition to the width b of the beam, the angle of arrival A is an important parameter to control to provide the beam with the maximum intensity. The angle of arrival A is defined by the outermost electrons in the beam as they leave the auxiliary electrode 400 on their way to the target T. The paths of those electrons are slightly curved. The arrival angle A is the angle between the tangent to the path of those outermost electrons as they reach the target T and the plane of symmetry at the center of the beam B. Twice this angle, or 2A, is also shown in FIG. 4.

The electrons even in an ideally focused beam are distributed across the target T in what is known as a gaussian distribution. This distribution is the result of the thermal energies of the electrons in the beam and can never as a practical matter be eliminated. Thermal energies can be reduced by employing a cold cathode made for example of $LaB_6$, or a p-n junction of GaAs; or ballistic injection may be used for emitting electrons at room temperature. The physics of the gaussian distribution is well known. It is important to minimize the effect on the beam intensity of that distribution.

Figure 5:
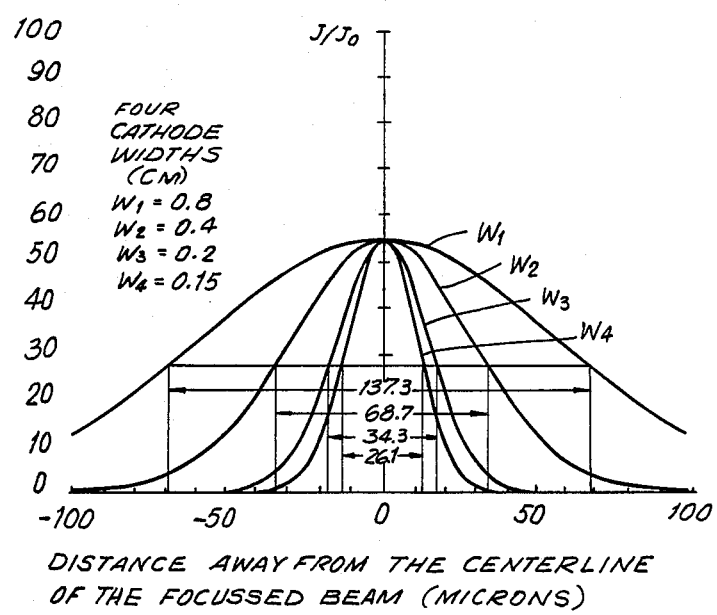
FIG. 5 is a plot of the distribution of the electrons at the focus of four electron beams generated using an electron beam gun in accordance with an embodiment of the present invention, each beam being generated with a cathode having a different width.

FIG. 5 illustrates the importance of minimizing the width of the cathode emitting island 104 to maximizing the intensity of the electron beam at the target. In FIG. 5 the current density of the beam at the cathode emitting surface is $J_O$, in $A/cm^2$, and the current density of the beam at the target surface is J, in $A/cm^2$. The ordinate axis in FIG. 5 is the normalized current density $J/J_O$. The abscissa axis is the distance in microns away from the centerline of an ideally focused beam with thermal energies imparted by a cathode 100 operating at 1000° C. Each plot $W_1$, $W_2$, $W_3$ and $W_4$ represents the electron distribution for a cathode emitting surface having the respective widths shown in FIG. 5. The current density J at the target decreases asymptotically to zero as the distance from the center of the beam increases, as shown in FIG. 5. It thus is necessary to assume a convenient definition for the beam width b. The definition involves first determining the distance from the center of the beam at which the current density has decreased to one-half of the current density at the beam center. That distance is then multiplied by two. The resulting width is called the full width of the beam at half maximum, often shortened to the FWHM beam width.

FIG. 5 shows that for a particular normalized current density $J/J_O$ in the center of the beam, and with all other operating parameters except cathode width being maintained the same, the FWHM decreases from 137.3 microns with an emitting island 0.8 cm wide to 26.1 microns with an emitting island that is 0.15 cm wide.

Figure 6:
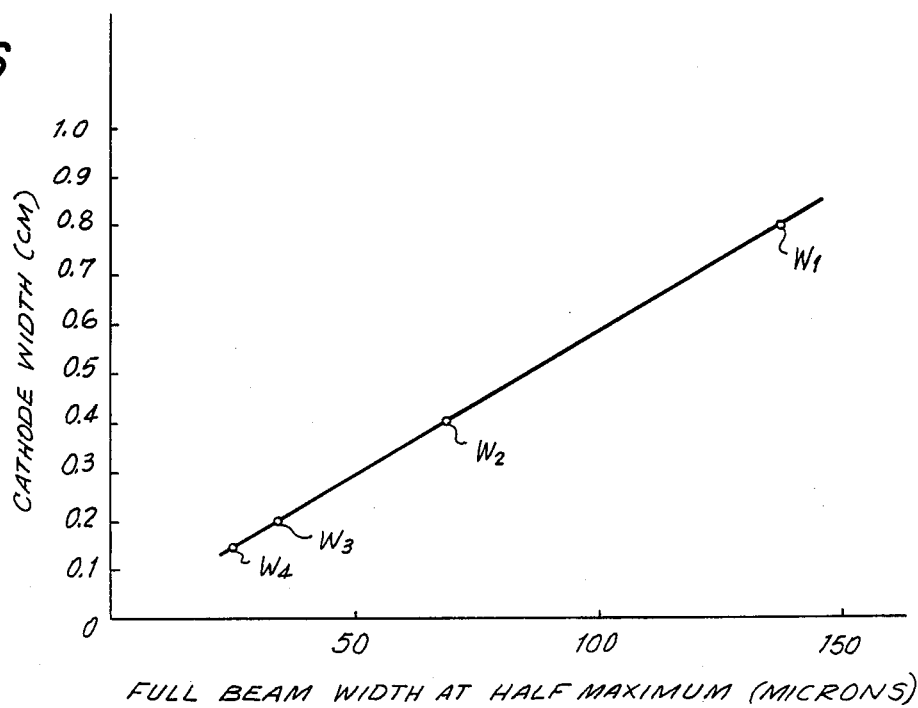
FIG. 6 is a plot of the beam widths shown in FIG. 5 versus the width of the cathode emitting surface.
Figure 9A:
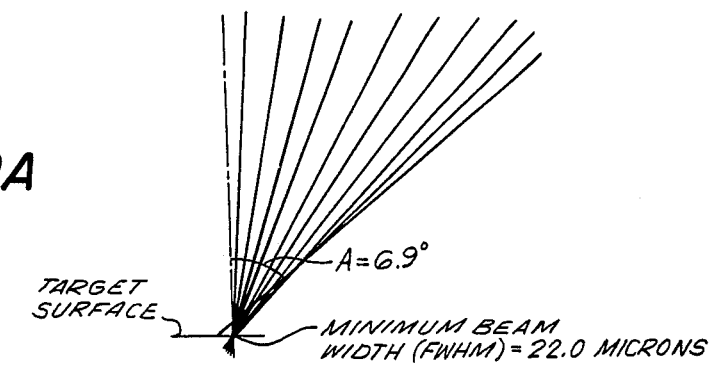
FIGS. 9A–9D schematically depict the focus of four electron beams generated using an electron beam gun in accordance with an embodiment of the present invention and illustrate the effect on the beam width of the beam angle of arrival when focusing aberrations are taken into account.
Figure 9B:
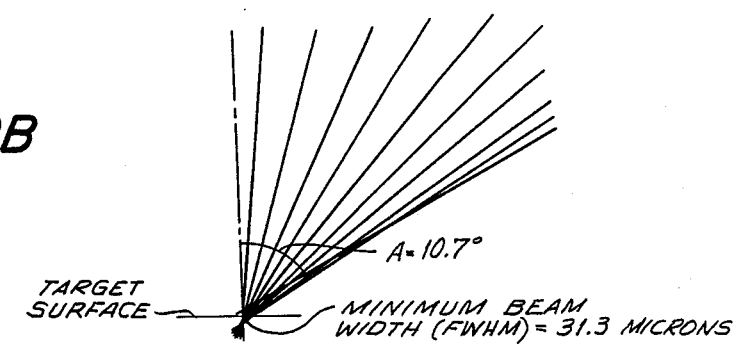
Figure 9C:
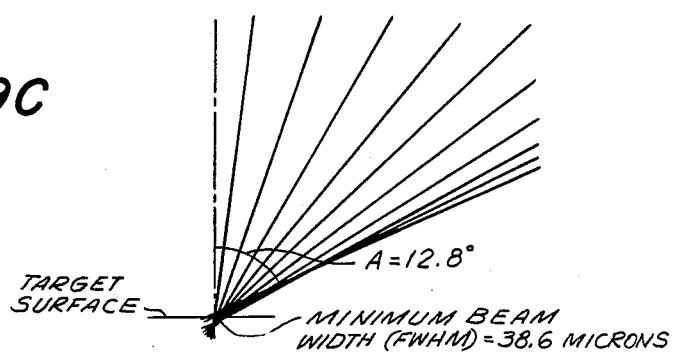
Figure 9D:
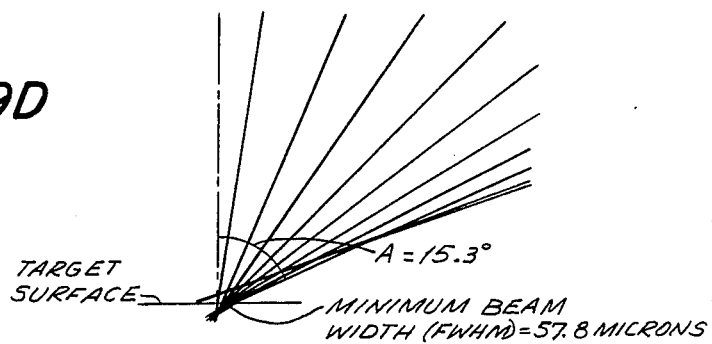

FIG. 6 is a plot of the FWHM beam width determined in FIG. 5 against the width of the cathode emitting island 104. If focusing errors are neglected, the relationship between the beam width and the emitting island width is linear, as FIG. 6 shows. It can be shown mathematically from the curves in FIG. 5 that a narrower beam width at the cathode emitting surface 104, all other beam parameters being equal, will increase the average power density across the beam at the target. Therefore, it is important to minimize the width of the cathode emitting surface. However, the cathode emitting surface, when taken with the other properties of the electron beam gun, must be able to provide the current densities at the target shown in FIG. 5. Otherwise, the assumptions used to construct FIG. 5 become invalid. With prior art electron beam guns, the strength of the potential gradient provided by the electrodes limited the extent to which the cathode emitting surface could be decreased. Put another way, the cathode emitting surface should be wider to increase current density but narrower to increase power density. In prior art electron beam guns the ultimate compromise between increasing and decreasing the cathode width yielded a power density that was inadequate as a practical matter.

The distribution of the electrons across the beam at focus due to their thermal energies is a consequence of the manner in which they are generated. The cathode is designed to operate in a space-charge limited condition. That is, in normal thermionic emission a "cloud" of electrons exists at the emitting surface. The electrons leave the cloud under the influence of the electric field provided by the potential difference between the cathode and the anode. As each electron in the cloud comes under the influence of the electric field, it has a principal force acting on it in a direction established by the electric field. But it also has an initial velocity derived from the thermal energy imparted to it by heating the cathode. In accordance with the principles of quantum mechanics, that initial velocity will assume a random direction at any given time. For all of the electrons entering the beam, the initial velocities will be distributed according to Maxwellian theory. Because the electrons must have thermal energy, it is impossible to eliminate these random electron motions as they enter the beam. In other words, it is inevitable that some electrons leaving the cloud will impact the target at locations displaced from the beam centerline, even if the focusing system is operating ideally.

In addition, since an electron exhibits a certain tendency to leave the cathode in a direction normal to the cathode surface at the point where the electron is emitted, roughness of the cathode surface increases the randomness of the initial direction of movement of the emitted electrons.

FIGS. 7A and 7B schematically illustrate the effect on the electron beam of thermal energy. FIG. 7A illustrates that a beam comprising electrons without thermal energy, with focusing under ideal conditions, can be brought to a line focus. However, as shown in FIG. 7B, the thermal energies of the electrons constituting the beam cause them to diverge from the ideal path shown in FIG. 6. The distribution at the target shown in FIG. 5 results.

Another parameter that has been found to affect the beam intensity because of the thermal energies of the electrons is the angle of arrival A, as defined in connection with FIG. 4. As the angle of arrival A increases, all other parameters being equal and assuming ideal focusing, the current density at the center of the beam increases and the beam width decreases. This is illustrated in FIG. 8, which shows the normalized current density J/Jo at the target and the beam width b (FWHM) for A=5°, 10°, 20° and 40°. Thus, if the angle of arrival A is increased, the beam width b as a result of the thermal energies of the electrons decreases and the power density of the beam is significantly increased.

In the discussion so far, it has been assumed that the beam is ideally focused. However, the magnetic field created by the focusing coils 502 focuses the electron beam B in a manner analogous to the focusing of light rays by optical lenses, and the principles of optics generally apply to electromagnetic focusing of an electron beam.

The electron beam B, then, is subject to conditions that, as a practical matter, prevent ideal focusing. Since the principles of optics apply to the focusing of the electron beam, those conditions are described herein using the names that would be given to them if an optical system were being described.

Ideal focusing of the electron beam is prevented primarily by aberrations in the lens system used to focus the beam. Spherical and chromatic aberrations contribute most to preventing the beam from being ideally focused. In other words, the electrons in an electron beam have properties analogous to the different wavelengths of white light that prevent focusing all such electrons to a single point, just as an optical lens cannot focus a ray of white light at a single point. And the passage of electrons through the focusing magnetic field at different locations prevents ideal focusing analogous to the spherical aberrations that result from the passage of light rays through an optical lens at different distances from the optical axis.

The beam width b as a result of focusing errors, primarily spherical and chromatic aberrations, has also been found to depend on the angle of arrival A of the beam. FIGS. 9A–9D are schematic illustrations of electron beams with four different angles of arrival A (the angles being exaggerated in the figures for clarity). As shown in FIGS. 9A–9D, as the angle of arrival A increases, the beam width b solely due to aberrations increases. The electron trajectories shown in FIGS. 9A–9D neglect the effects of the thermal energies of the electrons.

FIG. 10 is a composite plot of the FWHM beam width vs. angle of arrival using FIGS. 8 and 9A–9D. The curve E in FIG. 10 is a plot of the FWHM beam width versus the angle of arrival A solely as a result of the thermal energies of the electrons. The curve E plots data from FIG. 8. The curve F shows the FWHM beam width variation versus the angle of arrival A solely as a result of focusing errors. The curve F plots the data from FIGS. 9A–9D. The curve C in FIG. 10 shows the variation in beam width b as a result of both effects. The curve C is obtained by plotting the FWHM beam width at any given angle of arrival A obtained by adding the beam widths due to thermal energies (curve E) and aberrations (curve F). If that curve is plotted, the minimum beam width b in this example is 54 microns, with an angle of arrival A of about 9°.

It should be appreciated that the plots shown in FIGS. 5 and 8 and the electron trajectories shown in FIGS. 7A–7B were generated by a computer programmed to predict the electron beam which would result from the operation of the electron beam gun shown schematically in FIG. 3. The principles of physics governing electron beam behavior are well known. Consequently, the operation of the electron beam gun in accordance with the present embodiment of the invention can be generally predicted using those principles. Thus, the graphs of FIGS. 6 and 10 also show the theoretical properties of an electron beam gun in accordance with one embodiment of the present invention.

The actual operation of an electron beam gun in accordance with the present invention will differ somewhat from the theoretically predicted results. For example, the composite curve C in FIG. 10 was constructed by adding the beam width variation due to thermal energies versus arrival angle neglecting focusing errors (curve E) and the beam width variation due to focusing errors versus arrival angle neglecting thermal energies (curve F). In practice those two factors can influence each other, contrary to the assumption made to find the curve C. Another effect not taken into account is that the electrodes inevitably intercept small numbers of electrons emitted from the cathode. While that number is not significant in terms of realizing the advantages of the present invention, and substantially all of the electrons in the beam pass through the beam-shaping apertures 202, 302 and 404, it can make the actual operation of the gun somewhat different from the predicted operation.

Nevertheless, the computer-simulated operating characteristics depicted in FIGS. 5–10 are sufficiently close to the actual operating characteristics of an electron beam gun operated in accordance with the present invention to be extremely useful. It is possible with the aid of such a simulation to build an electron beam gun in which the intensity of the beam is optimized under actual operating conditions.

It has been found that with optimization of the various parameters governing the operation of an electron beam gun in accordance with the present invention, it is possible to generate a fine-line strip electron beam with much higher power density than with prior art electron beam gun apparatus.

The electron beam gun in accordance with a preferred embodiment of the present invention also enables provision to be made for the so-called secondary electrons and the positive ions created at the target T by the impinging electron beam.

Figure 11A:
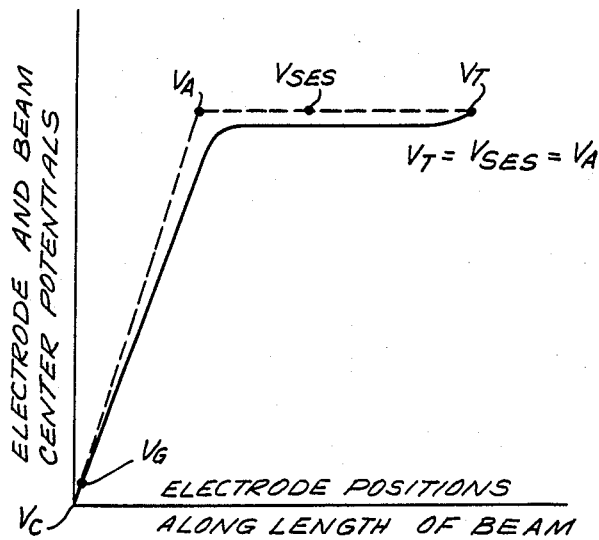
FIGS. 11A–11C are, respectively, plots of the electrode and beam center electrical potentials in an electron beam gun in accordance with three possible embodiments of the present invention versus the positions along the beam from the cathode to the target.
Figure 11B:
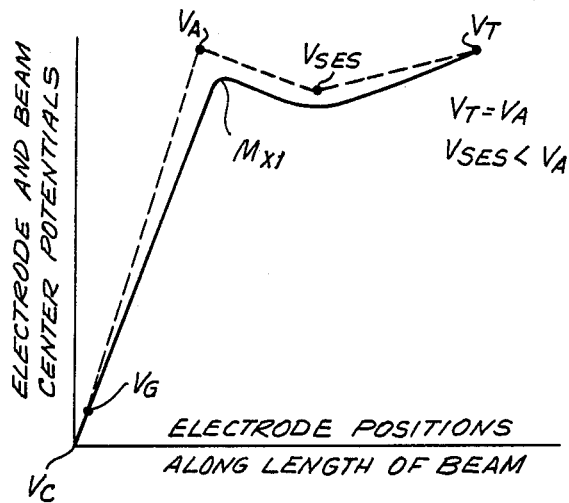
Figure 11C:
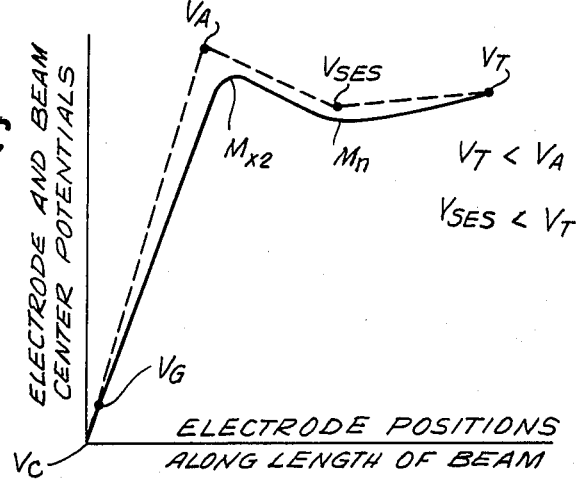

Referring to FIGS 11A–11C, three possible arrangements are shown for the electrical potentials of various parts of the gun 20. FIG. 11C shows the preferred arrangement. Normally the anode 300 will be at the highest potential in the gun. In the present embodiment the anode 300 is grounded, so that $V_A=0$. The cathode 100 is normally maintained at the lowest potential in the gun. The kinetic energy of the electrons as they reach the target T is generally determined by the voltage difference between the target T and the cathode 100. The kinetic energy of the electrons is an operating parameter that must be maintained at a given level depending on the application for which the gun is to be used. The cathode potential $V_C$ will typically be about $-10,000$ volts for causing melting to a depth of a few microns of a surface layer of polysilicon on a substrate to permit it to solidify into a single, large silicon crystal. In the present description, the use of the terms "higher" and "lower" potentials means the relative algebraic values of the potentials. For example, $-10,000$ volts is lower than zero volts.

The voltage $V_G$ of the grid 200 is maintained close to the voltage $V_C$ of the cathode 100. Typically, the grid voltage $V_G$ will be 99.3% of the cathode voltage $V_C$, or in the present embodiment, $V_G = -9930$ volts.

The auxiliary electrode 400 comprises a secondary electron suppression means that is maintained at a voltage $V_{SES}$ that is about 9% of the cathode voltage $V_C$. In the present embodiment, $V_{SES} = -900$ volts.

The target voltage $V_T$ is usually about 5% of the cathode voltage, or slightly higher than the auxiliary electrode voltage $V_{SES}$. In the present embodiment, $V_T = -500$ volts.

The beam voltage at the cathode and target, where the beam is in contact with the electrodes, is the same as the respective electrode voltages. Between the cathode and target, where the beam is not in contact with the electrodes, there is a potential difference between the beam and the various electrodes. In FIGS. 11A, 11B and 11C the voltage at the center of the beam is represented by a solid line, while the voltages of the several electrodes are represented by respective points connected by a broken line.

The voltages $V_C$, $V_A$, $V_{SES}$ and $V_T$ are provided as described because of the positive ions and secondary electrons created by the bombardment of the target T by the electron beam B. Since the net potential difference between the target and the cathode is very high, positive ions at the target, unless inhibited in some way, would accelerate toward the cathode emitting surface. If positive ions are not prevented from travelling back to the cathode, they bombard the cathode and shorten its life. The presence of secondary electrons in the vicinity of the target can disturb the electron beam.

FIGS. 11A-11C illustrate how the various voltages overcome those problems. In FIG. 11A, where the anode, auxiliary electrode and target voltages are identical, as shown by the dotted line in FIG. 11A, the actual voltage at the beam center line as a function of distance along the beam has a slope that is steeply positive between the cathode and the anode and positive, at least in part, between the anode and the target, as shown by the solid line. Immediately above the target there is a potential difference tending to suppress secondary electrons. That is, to the extent that secondary electrons are capable of leaving the target surface, the lower potential immediately above the target causes them immediately to return to the target. However, positive ions subjected to that same potential difference are initially accelerated slightly back toward the cathode and then are subjected to a drift region, in the vicinity of the auxiliary electrode SES, of virtually the same potential. The ions are generally free to drift in that region. If they are energetic enough and if the initial acceleration at the target surface was sufficient, they will come under the influence of the strong field between the anode and the cathode. Such ions will impact the cathode emitting surface with relatively great force.

The positive ions can be "trapped" by properly selecting the potentials of the auxiliary electrode and target relative to the anode. It is not sufficient merely to depress the voltage of the auxiliary electrode without also depressing the target voltage. If the target voltage is maintained the same as the anode voltage, the situation shown in FIG. 11B is obtained. The voltage in the center of the beam reaches a local maximum $M_{x1}$ in the vicinity of the anode which is lower than the target voltage $V_T$. The positive ions are thus still subject to a negative potential difference between the target and the anode which enables them to gather sufficient kinetic energy to cross the local maximum $M_{x1}$ and accelerate back to the cathode.

The target potential $V_T$ is thus depressed below the potential in the beam at the anode, as shown in FIG. 11C, to such an extent the local maximum $M_{x2}$ in the vicinity of the anode exceeds the target voltage $V_T$. Positive ions cannot gather enough kinetic energy during their acceleration from the target to the local minimum $M_n$ to cross the local maximum $M_{x2}$. Thus, positive ions are "trapped" between the target and the anode. However, the target potential is maintained above $V_{SES}$, so that secondary electrons are still suppressed at the target.

The use of an auxiliary electrode and a potential distribution similar to that shown in FIG. 11C is not new per se. However, it is new in an electron beam gun capable of providing electron beams with significantly higher power densities.

Figure 12:
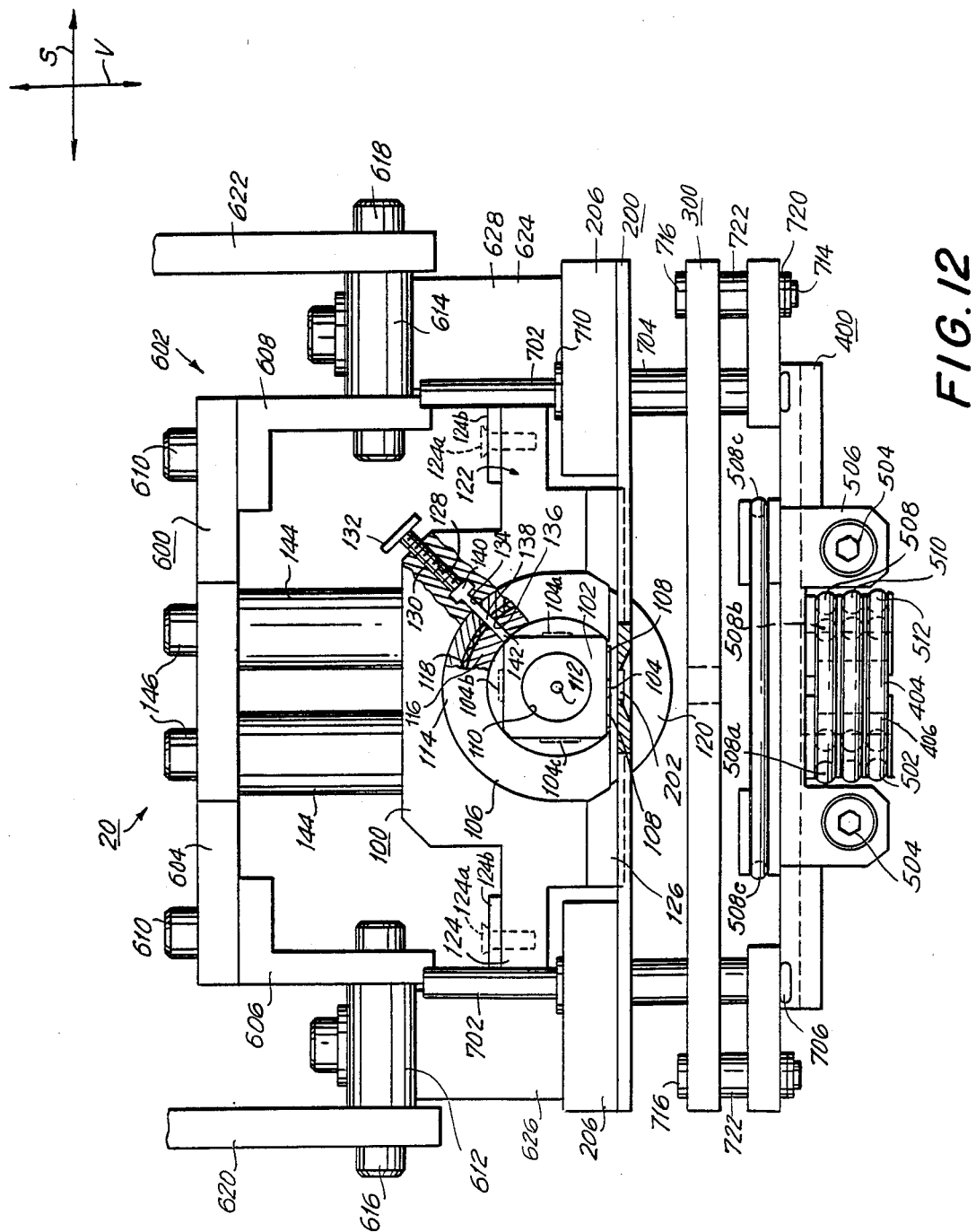
FIG. 12 is an end view, partly in section, of an electron beam gun in accordance with an embodiment of the present invention.

FIG. 12 is an end view of an electron beam gun 20 in accordance with a preferred embodiment of the present invention. A main frame 600 provides the primary structural support for the gun 20. The main frame 600 includes a hanger assembly 602 including a hanger bar 604 with uprights 606 and 608. The uprights 606 and 608 are bolted with bolts 610 to the hanger bar 604 and depend therefrom. The main frame 600 further comprises two support bars 612 and 614 bolted to the lower extremities of the uprights 606 and 608, respectively, by through bolts 616 and 618.

The hanger bar 604, the uprights 606 and 608 and the support bars 612 and 614 extend longitudinally parallel to the cathode assembly 100 and are slightly longer than the cathode assembly 100. At several longitudinal locations the support bar 612 is bolted to main mounting member 620 (only one of which is shown) by through bolts 616. The other support bar 614 also is secured to a plurality of main mounting members 622 by through bolts 618. The main mounting members 620 and 622 can be secured to suitable positioning means (not shown) to move the entire gun assembly 20.

The cathode assembly 100 includes the longitudinally extending sintered tungsten cathode 102 having a substantially square cross-section. The emitting island 104 is formed on one side of the square cathode 102. The cathode assembly 100 also includes a heat shield assembly 106. The square cathode 102 slides in and out of the heat shield assembly 106. Conveniently, emitting islands of different widths 104a, 104b and 104c can be formed on each side of the cathode 102, and the cathode can be inserted in the heat shield assembly 106 with any one of the emitting islands exposed. This arrangement is primarily useful in experimental applications to determine the effect of different cathode widths; thus the optional islands 104a–104c are shown in phantom lines in FIG. 12.

The thermionic emitting material in the emitting islands can diffuse into the surrounding part of the cathode 102. As a result, the width of the emitting surface is not precisely controlled. To prevent emission of electrons from that diffused material, alumina plateau shields 108 are placed on the surfaces of the cathode 102 at the sides of the emitting island 104. The shields 108 extend beyond the longitudinal ends of the emitting island, which does not extend the entire length of the cathode 102. The cathode 102 includes two circumferential grooves in the portion of the cathode 102 that extends longitudinally beyond the emitting island 104. Tantalum wires having molybdenum sheaths welded to them (not shown) fit in the grooves and wrap around the shields 108 to hold them in place. The ends of each wire are twisted together and folded into a cavity (not shown) in the cathode 102. Thus, the cathode 102 can be easily replaced by slipping it out of the heat shield assembly 106 and putting in a new cathode 102 with the plateau shields attached to it.

The cathode 102 has a circular bore 110 extending longitudinally therethrough. A heating filament 112 extends through the bore 110.

The heat shield assembly 106 protects the rest of the gun 20 from the extreme heat of the cathode 102, which in the present embodiment reaches temperatures in the range of 1200° C. It also serves to retain the heat in the cathode when the current to the filament 112 is turned off. In the operation of the electron beam gun 20, the filament current is turned off while the beam is being used because the magnetic field set up by the filament current can deflect the beam.

The heat shield assembly 106 includes two nested cylindrical shells 114 and 116 having several layers of molybdenum foil 118 interposed therebetween. The molybdenum foil 118 is dimpled so that when it is wrapped around the inner shell 116 before the outer shell 114 is installed, it maintains the heat-insulating space therebetween substantially uniform around the circumference of the cylinders 114 and 116. The ends of the cylinders 114 and 116 are closed by annular end caps 120, only one of which is shown (partly broken away) in FIG. 12.

The assembled cathode 102 and heat shield assembly 106 are clamped in a cathode holder assembly 122, which comprises an upper member 124 and a lower member 126 which clamp between them one end of the heat shield assembly 106. The upper member 124 is secured by fasteners 124a to flanges 124b which are secured to rods 702 discussed below. Another pair of upper and lower members (not shown) clamp the other end of the heat shield assembly.

Upper member 124 has four holes 128 (only one of which is shown in FIG. 12) extending in at 45° to the horizontal at each of the four upper corners of the cathode 102. A portion 130 of the hole 128 is tapped and accepts an adjusting screw 132. The remaining portion 134 of the hole 128 has a smaller diameter, which forms a shoulder where it opens into the larger diameter hole 130 and is not tapped. A hole 136 extends through the heat shield 106 and is aligned with the hole 128 in the upper clamping member 124. A push pin 138 has a head 140 that cooperates with the shoulder in the hole 128 and a shank 142 that extends through the portion 134 of the hole 128 and through the hole 134. The end of the shank 142 bears against a chamfered edge of the cathode 102. Turning the adjusting screws 132 moves the push pins 138 axially and allows microadjustment of cathode 102 relative to the heat shield assembly 106 so that the emitting island 104 is aligned with the center of the beam-forming aperture 202.

The cathode assembly 100 is mounted on the hanger bar 604 by four ceramic spacers 144 (only two being visible in FIG. 12) into which are screwed bolts 146.

Mounting means 624 mounts the grid 200, the anode 300 and the auxiliary electrode 400 on the support bars 612 and 614. The mounting means 624 includes a pair of ceramic grid hangers 626 and 628 that roughly position the grid 200 relative to the cathode emitting island 104. The grid 200 must be precisely located relative to the emitting island 104. In a preferred embodiment, the upper surface of the grid 200 is 0.38 mm away from the plane of the surface of the emitting island 104. The spacers 144 and the grid hangers 626 and 628 are carefully dimensioned to ensure approximately that spacing. Micro-adjustment of the emitting island 104 relative to the beam-shaping aperture 202 in the grid 200 is accomplished, as indicated above, using the screws 132.

The large potential differences between the anode 300, on one hand, and the cathode 100 and the grid 200, on the other, make it advantageous to provide the longest possible high-voltage breakdown path between them. The electron beam gun 20 thus includes mounting means 700 (FIG. 13) for mounting the electrodes to maximize the current path.

Figure 13:
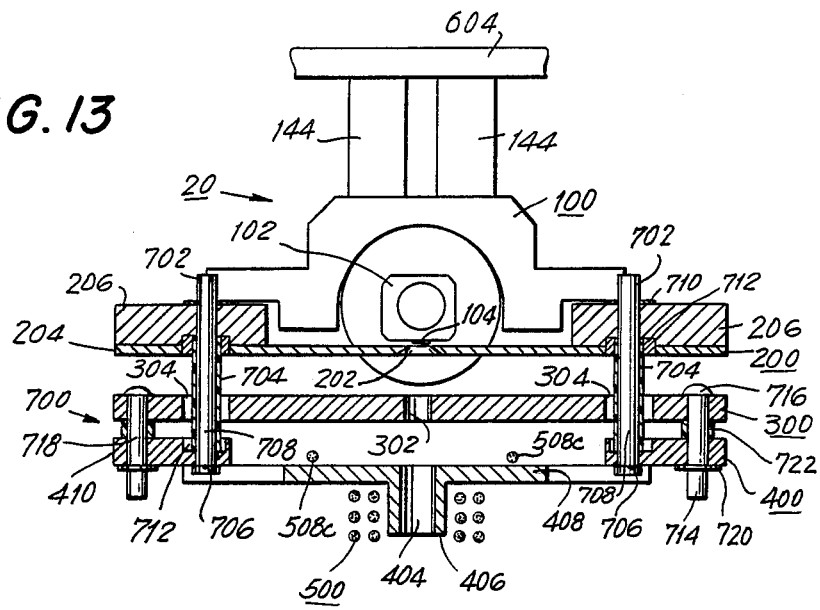
FIG. 13 is an end view, partly in section, of an electron beam gun in accordance with an embodiment of the present invention showing in more detail the mounting means for mounting the electrodes.

As FIG. 12 shows, the grid 200 is mounted on the main frame 600 of the gun 20 by the ceramic grid hangers 626 and 628. As FIG. 13 shows, the grid 200 includes an electrode 204 and two contact bars 206 that connect the grid 200 to a source of electrical potential. The auxiliary electrode 400 includes an electrode portion 408 and two contact bars 410. The grid 200 is directly connected to the auxiliary electrode 400 by a first plurality of insulating rods 702. The distance between the grid 200 and the auxiliary electrode 400 is maintained by a first plurality of insulating sleeves 704 that fit around the rods 702. Each of the rods 702 has an enlarged head 706 formed at one end and a shank portion that extends through clearance holes in the auxiliary electrode contact bars 410 and the grid electrode plate 204 and contact bars 206. Because of the large potential differences between the electrodes, the advantages of making them close together can not be realized unless some means is provided for preventing voltage breakdowns between the electrodes.

The potential-relieving means can also take other configurations. For example, the length of the current path between electrodes can be increased by making the sleeves with a surface configuration that provides a circuitous path between the electrodes.

The anode 300 is mounted to the auxiliary electrode 400 in a similar fashion. A second plurality of insulating rods 714 extend through the anode 300 and the auxiliary electrode 400. Each rod 714 includes an enlarged head 716 and a shank. The head 716 rests against the anode 300 and the shank extends through holes in the anode 300. The other end of the shank is smooth to allow a snap ring 720 to clamp on where the tightest fit can be realized. Each rod 714 has a spacer sleeve 722 around it. The spacer sleeves 722 establish the proper spacing between the anode 300 and the auxiliary electrode. Snap rings 710 clamp onto the shanks of the rods 702 to hold the auxiliary electrode and the grid 200 in the proper relative positions. The anode 300 includes a plurality of holes 304 that provide sufficient clearance for the passage therethrough of the rods 702 and spacers 704 without making electrical contact with the anode 300.

The locations at the grid 200 and at the auxiliary electrode 400 contacted by the ends of the spacers have counterbored recesses 712 that accept the spacers 704. Without the recesses 712, the potential gradient at the surface of the electrodes where contacted by the insulating spacers 704, that is, at the so-called "triple point" where a dielectric touches a conductor in the presence of gas molecules, increases significantly. That increase makes a voltage breakdown by, for example, the flow of current along the surface of the spacers 704, much more likely. However, the presence of the recesses 712 ameliorates the effect of the triple point and correspondingly decreases the likelihood of a voltage breakdown because of the large potential gradient.

The mounting means 700 thus provides a current leakage path between the grid 200 and the anode 300 that includes the lengths of the spacer sleeves 704 and the spacer sleeves 722. If the grid 200 and the anode 300 were directly connected, the current path would only be as long as the straight-line distance between them.

The focusing means 500 is shown in detail in FIGS. 12 and 13. The focusing means 500 includes the coils 502 forming a focusing magnet, which is constructed as a unitary structure and then secured to the auxiliary electrode 400 by bolts 504. The coils 502 are supported by a magnet frame 506 and are arranged in three layers 508, 510 and 512. Each layer has wire coils, for example, 508a and 508b, wound thereon. The portions of the wire coils that are adjacent to the ends of the beam tend to distort the ends of the beam. For example, as seen from "above" (i.e., viewing the target from the side thereof facing the cathode and looking in the direction in which the electrons move), the intersection of the beam with the target tends to be bent in a clockwise direction at each end or in a counterclockwise direction at each end, depending on the direction of the current in the focusing coils 508a, 508b. It is possible to correct that distortion to some extent by means of a correcting coil 508c which is mounted between the focusing coils 508a, 508b and the cathode and which carries a current having a clock-direction polarity (clockwise or counterclockwise) opposite that of the current in the coils 508a, 508b. A single layer of a single coil 508c has been used for this purpose. It does effect a small correction, since, by virtue of its position closer to the cathode, it has, in proportion to the current it carries, a greater effect on the positioning of the electrons at the target than have the coils 508a, 508b.

Figure 14:
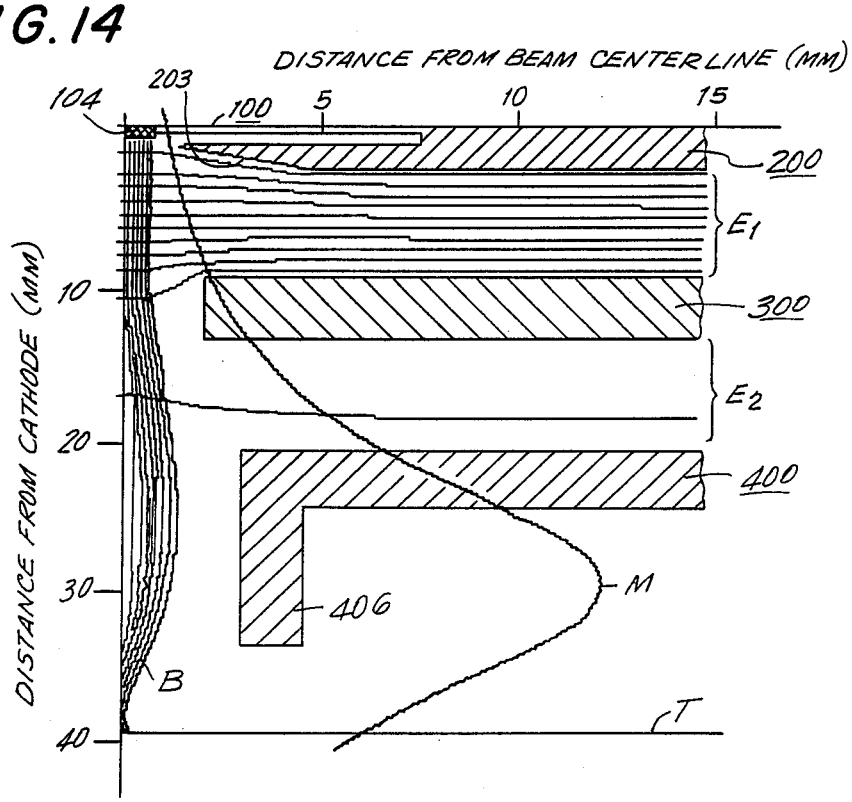
FIG. 14 schematically depicts the shape of an electron beam generated using an electron beam gun in accordance with an embodiment of the present invention.

In operation, means (not shown) is provided whereby the electrons in the beam B move through a vacuum between the cathode 100 and the target T. The cathode 100 is heated to its operating temperature by the filament 112. Prior to actual operation of the gun, the filament current is turned off to prevent distortion of the beam B by the magnetic field set up by the filament current. When the cathode 100, grid 200, anode 300 and auxiliary electrode 400 are maintained at their respective potentials as described above, and the focusing magnet 500 has current flowing therethrough, a beam B is created as depicted in FIG. 14. The electric field $E_1$ is extremely strong, as shown by the equipotential lines between the grid 200 and the anode 300. The beveled edges 203 of the grid 200 allow the electric field E to expand smoothly and controllably near the cathode emitting island 104. As a result, the electron beam B is initiated without any unpredictable perturbations. The properties of the electron beam B are also more predictable if the cathode emitting surface 104 is smooth enough to maintain it within the electron cloud. That way, all electrons will enter the beam at the same angle (except for thermal energies), rather than at an angle that depends on the direction in which they left the cathode emitting surface.

The focusing means creates a magnetic field the strength of which in gauss is plotted by the line M. There is only a small potential gradient in the area of the depending flange 406. Thus, the only force acting on the electron beam B is the magnetic forces from the focusing means. The magnetic field M is strong enough to focus the beam B beyond the magnet. The beam should take up no more than about 30% of the magnet bore, otherwise spherical aberrations, in particular, will be too great.

The mounting members 620 and 622 are movably secured to the surrounding structure to enable the gun to be moved closer to and farther from the target T, as indicated by the arrows V in FIG. 12, and to enable scanning of the target surface by movement of the gun in the directions of the arrows S in FIG. 12.

Apparatus in accordance with the invention has many uses, including but not limited to the following: melting amorphous silicon so that it recrystalizes as a single crystal; otherwise modifying the surface of other materials including ceramic materials and ferrite and other metals; and annealing after a process of ion implantation.

Although several specific embodiments of the invention have been described in detail herein with reference to the accompanying drawings, it is to be understood that the invention is not limited to those embodiments, and that various changes and modifications can be effected therein by one skilled in the art without departing from the scope or spirit of the invention as defined in the appended claims.

What is claimed is:

1. An electron beam gun for generating an electron beam directed at a target, the gun comprising:
   electrode means for creating an electric field along the direction of beam travel;
   focusing coils forming an electromagnet;
   means mounting said focusing coils downstream of said electrode means;
   cathode menas for emitting electrons and having a substantially flat, rectangular emitting island;
   drift region means for creating a region extending along the direction of beam travel having substantially no electric field therein and substantially coinciding with the location of said electromagnet;
   a correcting coil mounted between said focusing coils and said cathode means;
   means for establishing a direct current in said focusing coils having a first clock-direction polarity; and
   means for establishing a direct current in said correcting coil having a clock-direction polarity opposite said first polarity;
   wherein:
   said electrode means includes a substantially planar grid electrode disposed proximate to said emitting island and a substantially planar anode electrode disposed substantially parallel to and spaced apart from said grid electrode in the direction of travel of the electron beam;

each of said electrodes has a rectangular beam-shaping aperture therein aligned with said emitting island for passage of a beam of rectangular cross section substantially without interception of the electrons in the beam;

said electrode means and said focusing coils are disposed of accelerating electrons in the beam in nonparallel paths through said beam-shaping apertures and for converging the electrons in the beam in at least one cross-sectional dimension of the beam to minimize that dimension at a target;

said electromagnet extends along the direction of beam travel spaced from said anode electrode;

said drift-region means includes an auxiliary electrode including a conductive tube of rectangular cross section disposed in alignment with said beam-shaping apertures and spaced in the direction of the beam travel from said anode electrode;

said tube of rectangular cross section has two longer sides and two shorter sides;

said auxiliary electrode includes a substantially planar portion which is integral with the end of said tube closer to said anode and which lies in a plane substantially normal to the direction of said electron beam;

said focusing coils extend around said tube of rectangular cross section and create a magnetic field extending generally parallel to the direction of beam travel; and said correcting coil is substantially coaxial with said focusing coils and creates a magnetic field generally parallel to the direction of beam travel but directed oppositely to the magnetic field generated by said focusing coils;

whereby distortion of the intersection of said beam with said target caused by said focusing coils can to some extent be compensated for by said correcting coil.

2. An electron beam gun as in claim 1; wherein:

said cathode means includes electrical contact means for connecting an electrical potential to said cathode means to maintain said cathode means at a first electrical potential;

said grid electrode includes electrical contact means for connecting an electrical potential to said grid electrode to maintain said grid electrode at a second electrical potential slightly higher than said first electrical potential;

said anode electrode includes electrical contact means for connecting an electrical potential to said anode electrode to maintain said anode electrode at a third electrical potential substantially higher than said second electrical potential and slightly higher than the electrical potential at the target; and said auxiliary electrode includes electrical contact means for connecting an electrical potential to said auxiliary electrode to maintain said auxiliary electrode at a fourth electrical potential slightly lower than the anode potential and slightly lower than the electrical potential of the target.

3. An electron beam gun as in claim 2; wherein:

said cathode potential is about $-10,000$ volts;

said grid potential is about $-9,930$ volts;

said anode potential is ground; and said auxiliary electrode potential is about $-500$ volts.

4. An electron beam gun as in claim 2; wherein said emitting island is about 0.15 cm wide and the power density of the beam at focus is between about 1.0 megawatts/cm$^2$ and 1.5 megawatts/cm$^2$.

* * * * *

UNITED STATES PATENT AND TRADEMARK OFFICE
CERTIFICATE OF CORRECTION

PATENT NO. : 4,731,537

DATED : March 15, 1988

INVENTOR(S) : Kenneth E. Williams and Michael Fletcher

It is certified that error appears in the above-identified patent and that said Letters Patent is hereby corrected as shown below:

IN THE CLAIMS

Column 15, line 7, change "of" to --for--.

Signed and Sealed this

Third Day of January, 1989

Attest:

DONALD J. QUIGG

Attesting Officer

Commissioner of Patents and Trademarks